United States Patent
Hosogi et al.

(10) Patent No.: US 11,561,721 B1
(45) Date of Patent: Jan. 24, 2023

(54) DATA REPLICATION SYSTEM AND DATA REPLICATION METHOD

(71) Applicant: Hitachi, Ltd., Tokyo (JP)

(72) Inventors: Koji Hosogi, Tokyo (JP); Akira Deguchi, Tokyo (JP); Takaki Matsushita, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 17/474,500

(22) Filed: Sep. 14, 2021

(30) Foreign Application Priority Data

Jul. 16, 2021 (JP) .............................. JP2021-117972

(51) Int. Cl.
*G06F 3/06* (2006.01)
*H03M 7/30* (2006.01)

(52) U.S. Cl.
CPC .............. *G06F 3/065* (2013.01); *G06F 3/067* (2013.01); *G06F 3/0608* (2013.01); *H03M 7/60* (2013.01)

(58) Field of Classification Search
CPC ........ G06F 3/065; G06F 3/0608; G06F 3/067; H03M 7/60
See application file for complete search history.

(56) References Cited

U.S. PATENT DOCUMENTS

| | | | |
|---|---|---|---|
| 7,930,436 B1* | 4/2011 | Znosko | H04L 69/04 709/247 |
| 2013/0151770 A1 | 6/2013 | Hara et al. | |
| 2013/0305003 A1* | 11/2013 | Matsushita | G06F 3/0665 711/162 |
| 2014/0250271 A1 | 9/2014 | Hara et al. | |
| 2016/0323098 A1* | 11/2016 | Bathen | H04L 63/00 |
| 2019/0171370 A1* | 6/2019 | Kedia | G06F 3/0608 |

FOREIGN PATENT DOCUMENTS

JP      2014-524601 A     9/2014

* cited by examiner

*Primary Examiner* — Jason W Blust
(74) *Attorney, Agent, or Firm* — Volpe Koenig

(57) ABSTRACT

A first storage system compresses data relating to read and write by a primary site and stores the data in a first physical volume. A second storage system compresses data relating to read and write by a secondary site and stores the data in a second physical volume. When performing replication for transferring the data stored in the first physical volume of the first storage system to the second storage system and storing the data in the second physical volume, the first storage system and the second storage system determine, based on a compression scheme executable by the first storage system and a compression scheme executable by the second storage system, a compression scheme to be applied to transfer target data and transfer the transfer target data compressed by the determined compression scheme.

7 Claims, 13 Drawing Sheets

DATA REPLICATION SYSTEM AND DATA REPLICATION METHOD

BACKGROUND OF THE INVENTION

Field of the Invention

The present invention relates to a data replication system and a data replication method.

Description of the Related Art

For data processing of a storage system, a technique is described in National Publication of International Patent Application No. 2014-524601 (Patent Literature 1). In this publication, there is the description "A first storage system includes a first RAID group configured by a plurality of first storage devices on which a first logical volume is based. A second storage system includes a second RAID group configured by a plurality of second storage devices on which a second logical volume is based. A RAID configuration of the first RAID group and a RAID configuration of the second RAID group are the same. A type of a compression/decompression function of the first storage devices and a type of a compression/decompression function of the second storage devices are the same. For data in the first logical volume, compressed data is read from the first storage device without being decompressed. The read compressed data is written in the second storage device present in the same position as the position in the first storage device in the second RAID group".

According to Patent Literature 1, it is possible to reduce an amount of data transmitted and received between the storage systems. However, this technique cannot be applied when compression schemes are different between the first storage system and the second storage system. The second storage system is desired to be configured with reduced processing performance compared with the first storage system. Therefore, it has been demanded to realize replication having high versatility applicable even when there are differences of compression schemes and performance between the storage systems and capable of suppressing a communication amount.

SUMMARY OF THE INVENTION

Therefore, an object of the present invention is to realize replication having high versatility and capable of suppressing a communication amount.

In order to achieve the object, representative one data replication system of the present invention includes: a first storage system including a processor and providing a primary site; and a second storage system including a processor and providing a secondary site. The first storage system compresses data relating to read and write by the primary site and stores the data in a first physical volume. The second storage system compresses data relating to read and write by the secondary site and stores the data in a second physical volume. When performing replication for transferring the data stored in the first physical volume of the first storage system to the second storage system and storing the data in the second physical volume, the first storage system and the second storage system determine, based on a compression scheme executable by the first storage system and a compression scheme executable by the second storage system, a compression scheme to be applied to transfer target data and transfer the transfer target data compressed by the determined compression scheme.

Representative one data replication method of the present invention is a data replication method performed by a data replication system including: a first storage system including a processor and configured to compress data relating to read and write by a primary site and store the data in a first physical volume; and a second storage system including a processor and configured to compress data relating to read and write by a secondary site and store the data in a second physical volume. The data replication method including: a step in which the first storage system compresses the data relating to read and write by the primary site with a first compression scheme and stores the data in the first physical volume; a step in which, when performing replication for transferring the data stored in the first physical volume of the first storage system to the second storage system and storing the data in the second physical volume, the first storage system and the second storage system determine, based on a compression scheme executable by the first storage system and a compression scheme executable by the second storage system, a compression scheme to be applied to transfer target data; and a step in which the first storage system and the second storage system transfer the transfer target data compressed by the determined compression scheme.

According to the present invention, it is possible to realize replication having high versatility and capable of suppressing a communication amount. Problems, configurations, and effects other than those described above are clarified by the following explanation of embodiments.

DETAILED DESCRIPTION OF THE PREFERRED EMBODIMENTS

Embodiments of the present invention are explained below with reference to the drawings.

First Embodiment

Figure 1:
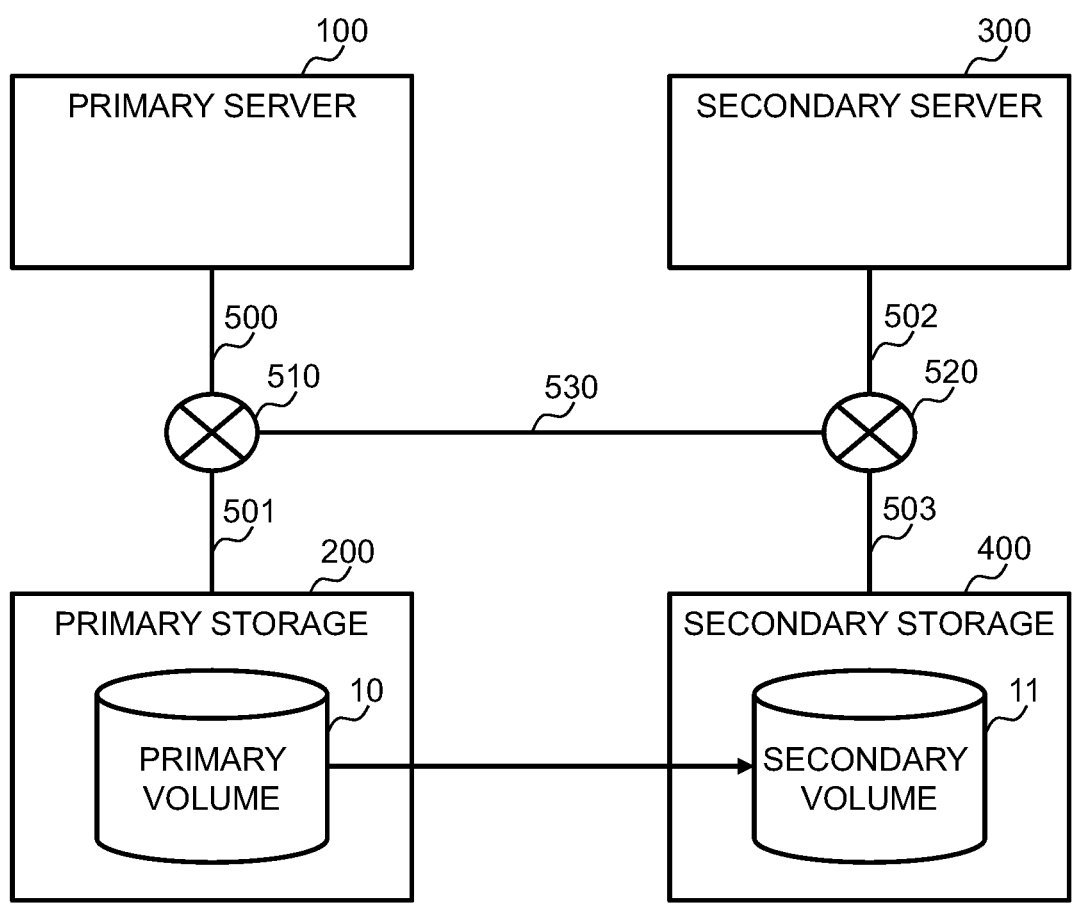
FIG. 1 is a configuration diagram of a data replication system according to a first embodiment.

FIG. 1 is a configuration diagram of a data replication system according to a first embodiment. The data replication system shown in FIG. 1 includes a first storage system that provides a primary site and a second storage system that provides a secondary site.

Specifically, the data replication system has a configuration in which a primary server 100 and a primary storage 200 are connected to a network 510, a secondary server 300 and a secondary storage 400 are connected to a network 520, and the network 510 and the network 520 are connected.

Note that the primary server 100 and the network 510 are connected by a communication line 500. The primary storage 200 and the network 510 are connected by a communication line 501. The secondary server 300 and the network 520 are connected by a communication line 502. The secondary storage 400 and the network 520 are connected by a communication line 503.

The primary server 100 is a server that issues an I/O on the primary site side.

The primary storage 200 is a storage for data storage on the primary site side and includes a primary volume 10. The primary storage 200 operates as a storage that retains master data in the data replication system.

The secondary server 300 is a server that issues an I/O on the secondary site side.

The secondary storage 400 is a storage for data storage on the secondary site side and includes a secondary volume 11. The secondary storage 400 operates as a storage that retains replicated data in the data replication system.

Figure 2:
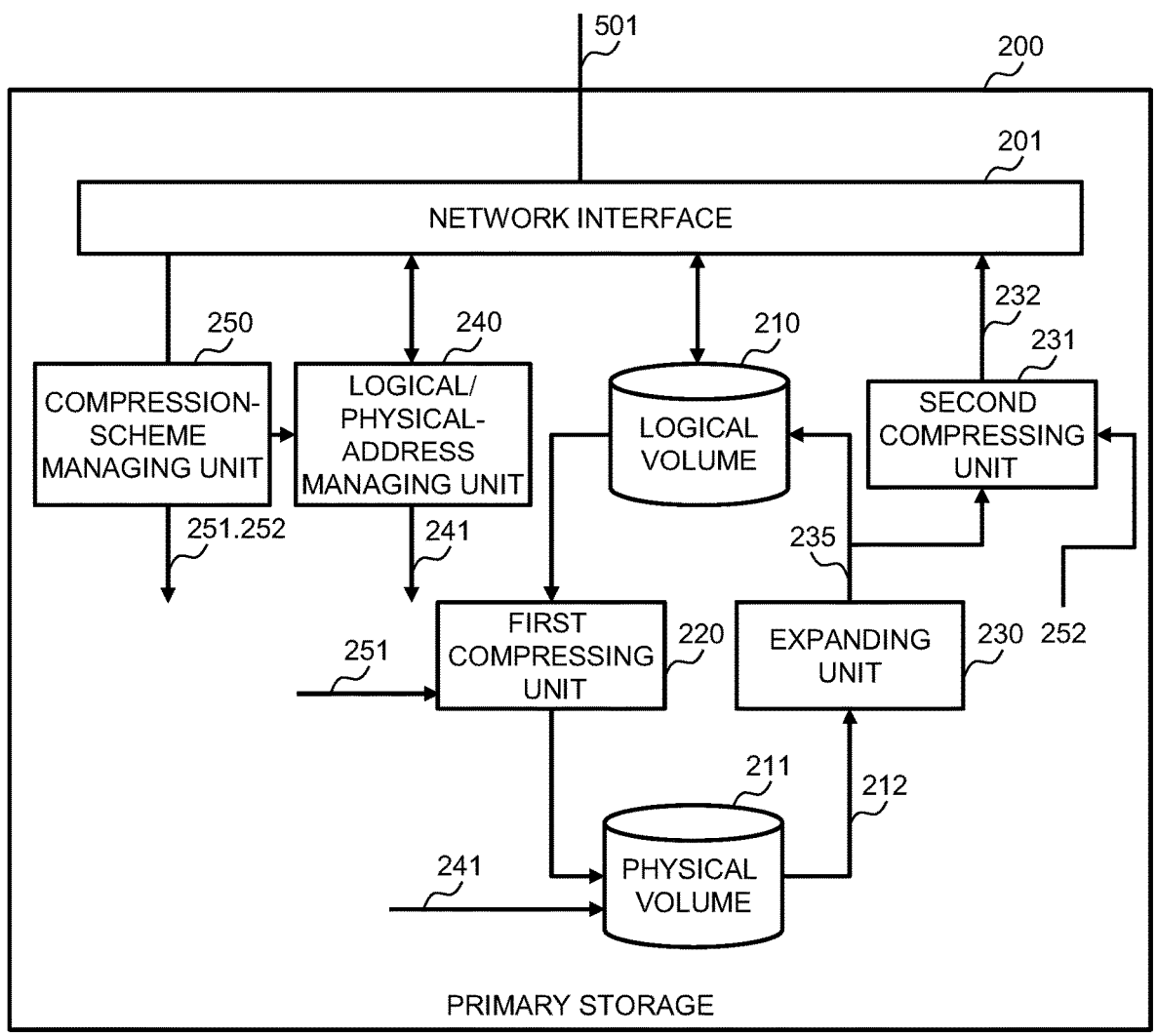
FIG. 2 is an explanatory diagram of a primary storage in the first embodiment.

FIG. 2 is an explanatory diagram of the primary storage 200 in the first embodiment. As shown in FIG. 2, the primary storage 200 includes a network interface 201, a logical volume 210, a physical volume 211, a first compressing unit 220, a decompressing unit 230, a second compressing unit 231, a logical/physical-address managing unit 240, and a compression-scheme managing unit 250.

When write by the primary site is processed, the network interface 201 receives a write request via the communication line 501 and writes data in the logical volume 210. The data written in the logical volume 210 is compressed by the first compressing unit 220 and written in the physical volume 211 as compressed data.

When read by the primary site is processed, the network interface 201 receives a read request via the communication line 501 and reads compressed data 212 from the physical volume 211. The read compressed data is decompressed by the decompressing unit 230 to be decompressed data 235 and is written in the logical volume 210 to enable a read response.

When data in the physical volume 211 is transmitted to the secondary storage 400 and replication is performed, target compressed data is read from the physical volume 211 and decompressed by the decompressing unit 230 to be the decompressed data 235 and, thereafter, compressed by the second compressing unit 231 and transmitted to the secondary storage 400 as compressed data 232.

The logical/physical-address managing unit 240 includes a management table in which a logical address of the logical volume 210 and a physical address to be stored in the physical volume 211 are mapped. When write in the physical volume 211 is performed, a physical address 241 is generated every time and passed to the physical volume 211.

The compression-scheme managing unit 250 manages compression and decompression processing in the primary storage 200. A compression algorithm used by the first compressing unit 220, that is, a main algorithm used when generating compressed data to be stored in the physical volume 211 is represented as a first compression algorithm for convenience. On the other hand, a main algorithm used by the secondary storage 400, which is a replication destination, when storing data relating to read and write by the secondary site in the physical volume is represented as a second compression algorithm for convenience. Note that the first and second compression algorithms are not defined by a storage that uses the first and second compression algorithms. For example, the second compression algorithm is sometimes used in the primary storage 200 as explained below. A plurality of compression algorithms is present in the first compression algorithm or the same compression algorithm is included in the first compression algorithm and the second compression algorithm.

The compression-scheme managing unit 250 outputs a compression scheme designation signal 251 for designating the first compression algorithm and a compression scheme designation signal 252 for designating the second compression algorithm to control a compression algorithm in use. Specifically, the compression-scheme managing unit 250 gives the compression scheme designation signal 251 to the first compressing unit 220 and gives the compression scheme designation signal 252 to the second compressing unit 231.

A plurality of algorithms usable by the second compressing unit 231 may be present. In this case, the second compression algorithm is selected according to a replication destination.

Figure 3:
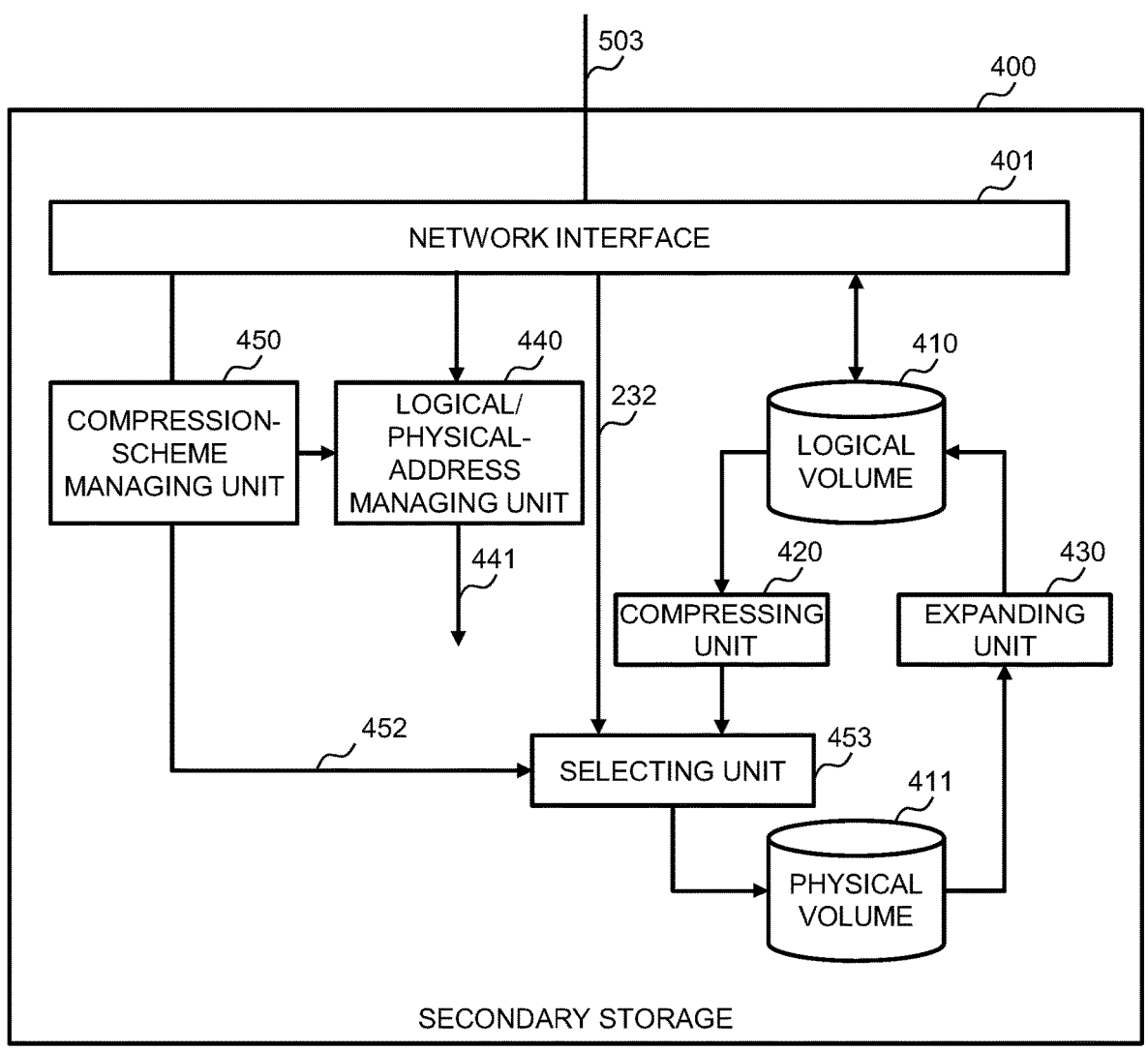
FIG. 3 is an explanatory diagram of a secondary storage in the first embodiment.

FIG. 3 is an explanatory diagram of the secondary storage 400 in the first embodiment. As shown in FIG. 3, the secondary storage 400 includes a network interface 401, a logical volume 410, a physical volume 411, a compressing unit 420, and decompressing unit 430, a selecting unit 453, a logical/physical-address managing unit 440, and a compression-scheme managing unit 450.

When the network interface 401 receives the compressed data 232 from the primary storage 200, the compressed data 232 is directly stored in the physical volume 411 via the selecting unit 453. This is because, since the compressed data 232 is compressed by the second compression algorithm used by the secondary storage 400, it is unnecessary to decompress and recompress the compressed data 232.

For example, when an abnormality occurs in the primary storage 200 and the secondary storage 400 processes write by the secondary site, the network interface 401 receives a write request via the communication line 503 and writes data in the logical volume 410. The data written in the logical volume 410 is compressed by the compressing unit 420. At this time, the compressing unit 420 uses the second compression algorithm. The compressed data is written in the physical volume 411 via the selecting unit 453.

When read by the secondary site is processed, the network interface 401 receives a read request via the communication line 503. The compressed data 232 is read from the physical volume 411. The read compressed data is decompressed by the decompressing unit 430 to be decompressed data and is written in the logical volume 410 to enable a read response.

The logical/physical-address managing unit 440 includes a management table in which a logical address of the logical volume 410 and a physical address to be stored in the physical volume 411 are mapped. When write is performed in the physical volume 411, a physical address 441 is generated every time and passed to the physical volume 411.

The compression-scheme managing unit 450 manages compression and decompression processing in the secondary storage 400. The secondary storage 400 does not need to perform compression processing in replication and performs the compression processing when write by the I/O of the secondary site is performed during failover. The compression-scheme managing unit 450 gives a control signal 452 to the selecting unit 453 to switch processing at a replication time and processing at a write time by the I/O.

Figure 4:
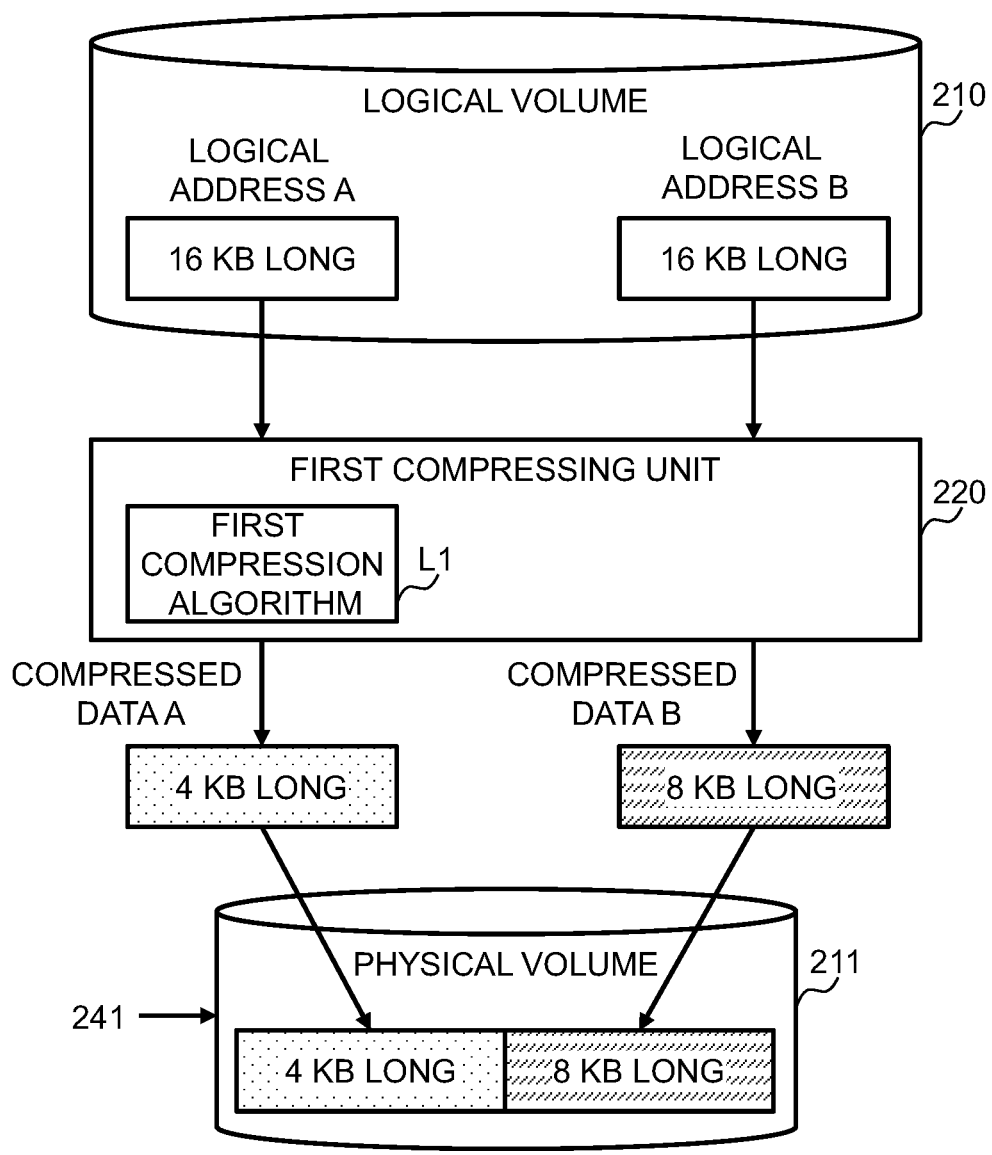
FIG. 4 is an explanatory diagram about compression and data storage in the primary storage.

FIG. 4 is an explanatory diagram about compression and data storage in the primary storage 200. In FIG. 4, first, data of a logical address A and data of a logical address B are stored in the logical volume 210. In the logical volume 210, both of the data of the logical address A and the data of the logical address B have 16 KB length.

The first compressing unit 220 compresses the data of the logical address A with a first compression algorithm L1 and generates compressed data A. A size of the compressed data A is reduced to 4 KB length by the compression.

Similarly, the first compressing unit 220 compresses the data of the logical address B with the first compression algorithm L1 and generates compressed data B. A size of the compressed data B is reduced to 8 KB length by the compression.

The compressed data A and the compressed data B are written in continuous addresses of the physical volume 211. By compressing the data on the logical volume 210 and writing the compressed data in the continuous addresses in this way, it is possible to efficiently use a data capacity of the physical volume 211.

Figure 5:
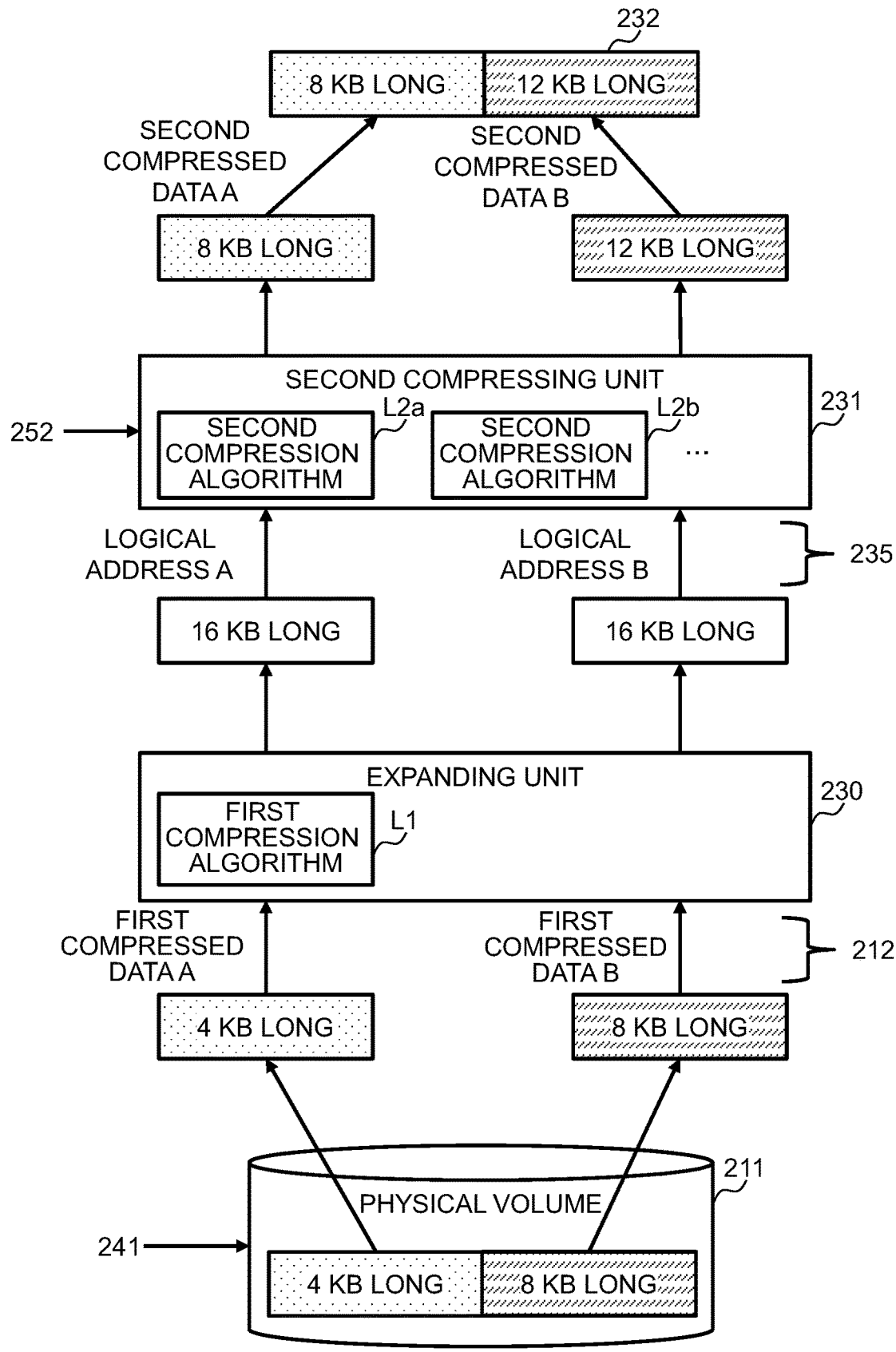
FIG. 5 is an explanatory diagram about decompression and recompression in the primary storage.

FIG. 5 is an explanatory diagram about decompression and recompression in the primary storage 200. In replication, first, the compressed data A and the compressed data B are read from the physical volume 211. The compressed data A and the compressed data B read from the physical volume 211 are in a state in which the compressed data A and the compressed data B are compressed by the first compression algorithm L1. Therefore, the compressed data A and the compressed data B are referred to as first compressed data A and first compressed data B. The first compressed data A and the first compressed data B are specific examples of the compressed data 212 shown in FIG. 2.

The decompressing unit 230 performs decompression processing of the first compressed data A based on the first compression algorithm L1. Decompressed data obtained by the decompression is the data of the logical address A.

Similarly, the decompressing unit 230 performs decompression processing of the first compressed data B based on the first compression algorithm L1. Decompressed data obtained by the decompression is the data of the logical address B.

The second compressing unit 231 recompresses the decompressed data. The second compressing unit 231 corresponds to a plurality of second compression algorithms. In FIG. 5, second compression algorithms L2a and L2b are illustrated. The second compressing unit 231 selects a second compression algorithm according to a secondary storage at a replication destination. In the following explanation, it is assumed that the secondary storage 400 at the replication destination uses the second compression algorithm L2a.

The second compressing unit 231 recompresses the data of the logical address A with the second compression algorithm L2a and generates compressed data. The compressed data is referred to as second compressed data A.

Similarly, the second compressing unit 231 recompresses the data of the logical address B with the second compression algorithm L2a and generates compressed data. The compressed data is referred to as second compressed data B.

The second compressed data A and the second compressed data B are combined to be a specific example of the compressed data 232 shown in FIG. 2.

Figure 6:
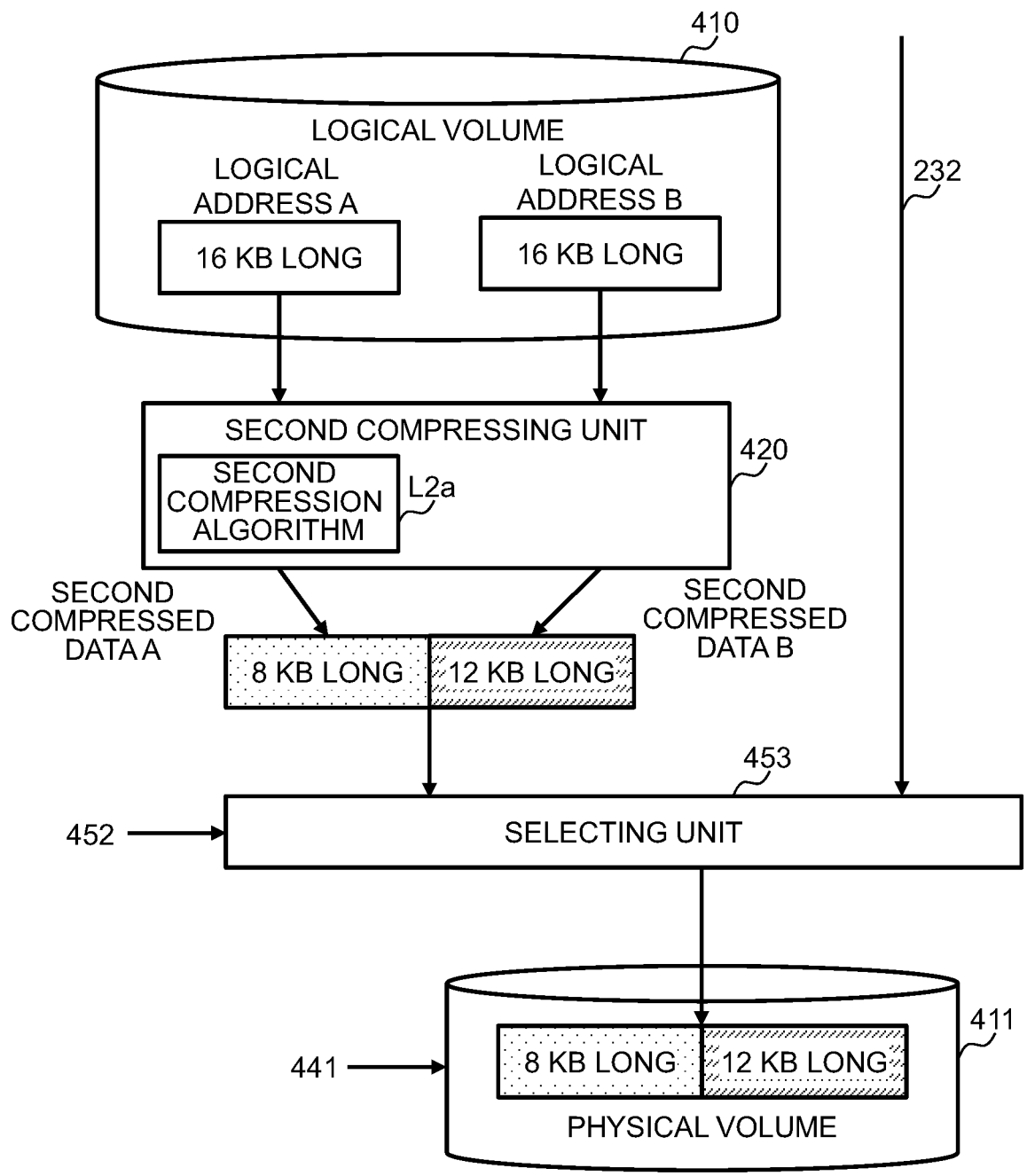
FIG. 6 is an explanatory diagram about compression and data storage in the secondary storage.

FIG. 6 is an explanatory diagram about compression and data storage in the secondary storage 400. In FIG. 6, first, the data of the logical address A and the data of the logical address B are stored in the logical volume 410. In the logical volume 410, both of the data of the logical address A and the data of the logical address B have 16 KB length.

The second compressing unit 420 compresses the data of the logical address A with the second compression algorithm L2a and generates the second compressed data A. A size of the second compressed data A is reduced to 8 KB length by the compression.

Similarly, the second compressing unit 420 compresses the data of the logical address B with the second compression algorithm L2a and generates the second compressed data B. A size of the second compressed data B is reduced to 8 KB length by the compression.

The second compressed data A and the second compressed data B are combined and written in the physical volume 411 via the selecting unit 453.

On the other hand, the compressed data 232 received from the primary storage 200 at a replication time is in a state in which the compressed data 232 is already compressed by the second compression algorithm L2a. Therefore, the compressed data 232 is directly written in the physical volume 411 via the selecting unit 453 without being decompressed and recompressed.

Figure 7:
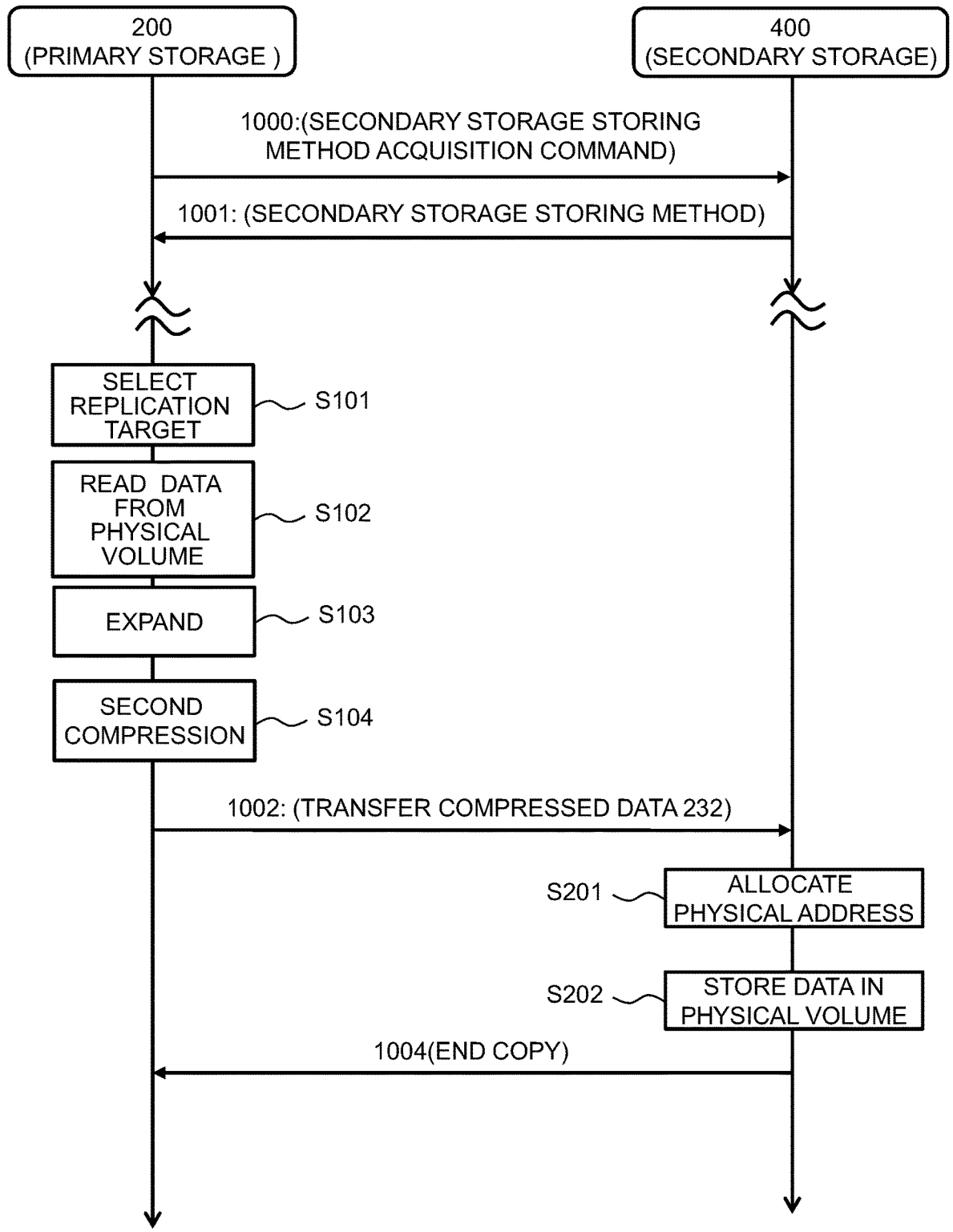
FIG. 7 is a sequence chart for explaining a processing operation of replication in the first embodiment.

FIG. 7 is a sequence chart for explaining a processing operation of replication in the first embodiment. First, the primary storage 200 transmits a secondary storage storing method acquisition command to the secondary storage 400 (1000). The secondary storage 400 notifies a secondary storage storing method, that is, a compression algorithm used by the secondary storage 400 to the primary storage 200 (1001). The primary storage 200 determines, as a compression algorithm of data to be transferred, a compression algorithm usable by the primary storage 200 and the secondary storage 400 in common. When the compression algorithm of the data to be transferred is a compression algorithm used at a primary storage storing time, decompression and recompression explained below (steps S103 and S104) can be omitted. Otherwise, the decompression and the recompression explained below are performed such that the data can be compressed and decompressed by the secondary storage 400. When a compression algorithm usable in common is absent, the primary storage 200 performs only the decompression (step S103) and the secondary storage 400 performs the recompression (step S104) using a compression algorithm usable by the secondary storage 400. These kinds of processing are performed, for example, at a system construction time or a replication setting time. The notified compression algorithm of the secondary storage 400 is managed by the primary storage 200. Thereafter, the subsequent replication processing is periodically executed.

In the replication processing, first, the primary storage 200 selects replication target data (step S101). For example, the primary storage 200 only has to select a difference from the last replication as a target.

After step S101, the primary storage 200 reads the data selected as the target from the physical volume 211 (step S102), decompresses the data based on the first compression algorithm (step S103), and recompresses the data with the second compression algorithm (step S104).

The primary storage 200 transfers compressed data generated by the recompression to the secondary storage 400 (1002).

The secondary storage 400 allocates a physical address to the compressed data received from the primary storage 200 (step S201), stores the compressed data in the physical volume 411 (step S202), and notifies a copy end to the primary storage 200 (1004).

Note that processing for notifying the copy end after storing the compressed data in the physical volume 411 is illustrated above. However, the secondary storage 400 may be configured to store the compressed data received from the primary storage 200 in a cache, notify the copy end to the primary storage 200, and, thereafter, store the compressed data in the physical volume 411.

Second Embodiment

Figure 8:
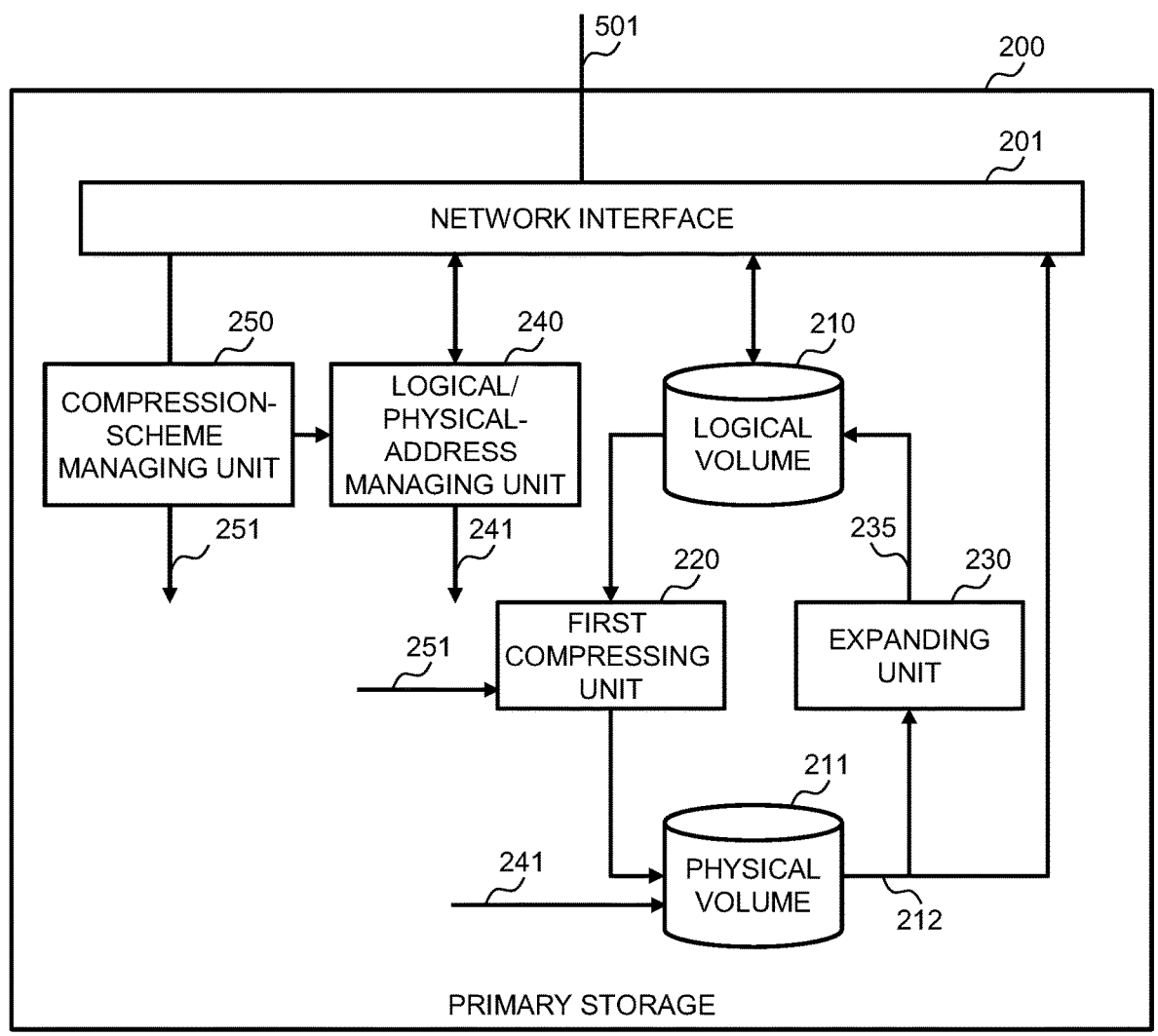
FIG. 8 is an explanatory diagram of a primary storage in a second embodiment.

FIG. 8 is an explanatory diagram of the primary storage 200 in a second embodiment. As shown in FIG. 2, the primary storage 200 includes the network interface 201, the logical volume 210, the physical volume 211, the first compressing unit 220, the decompressing unit 230, the logical/physical-address managing unit 240, and the compression-scheme managing unit 250 but does not include the second compressing unit 231.

When transmitting data in the physical volume 211 to the secondary storage 400 and performing replication, the primary storage 200 in the second embodiment reads the target compressed data 212 from the physical volume 211 and directly transmits the target compressed data 212 to the secondary storage 400. That is, in the second embodiment, data for replication is transmitted while keeping a state in which the data is compressed by the first compression algorithm.

Explanation about the other operations is omitted because the other operations are the same as the operations in the first embodiment.

Figure 9:
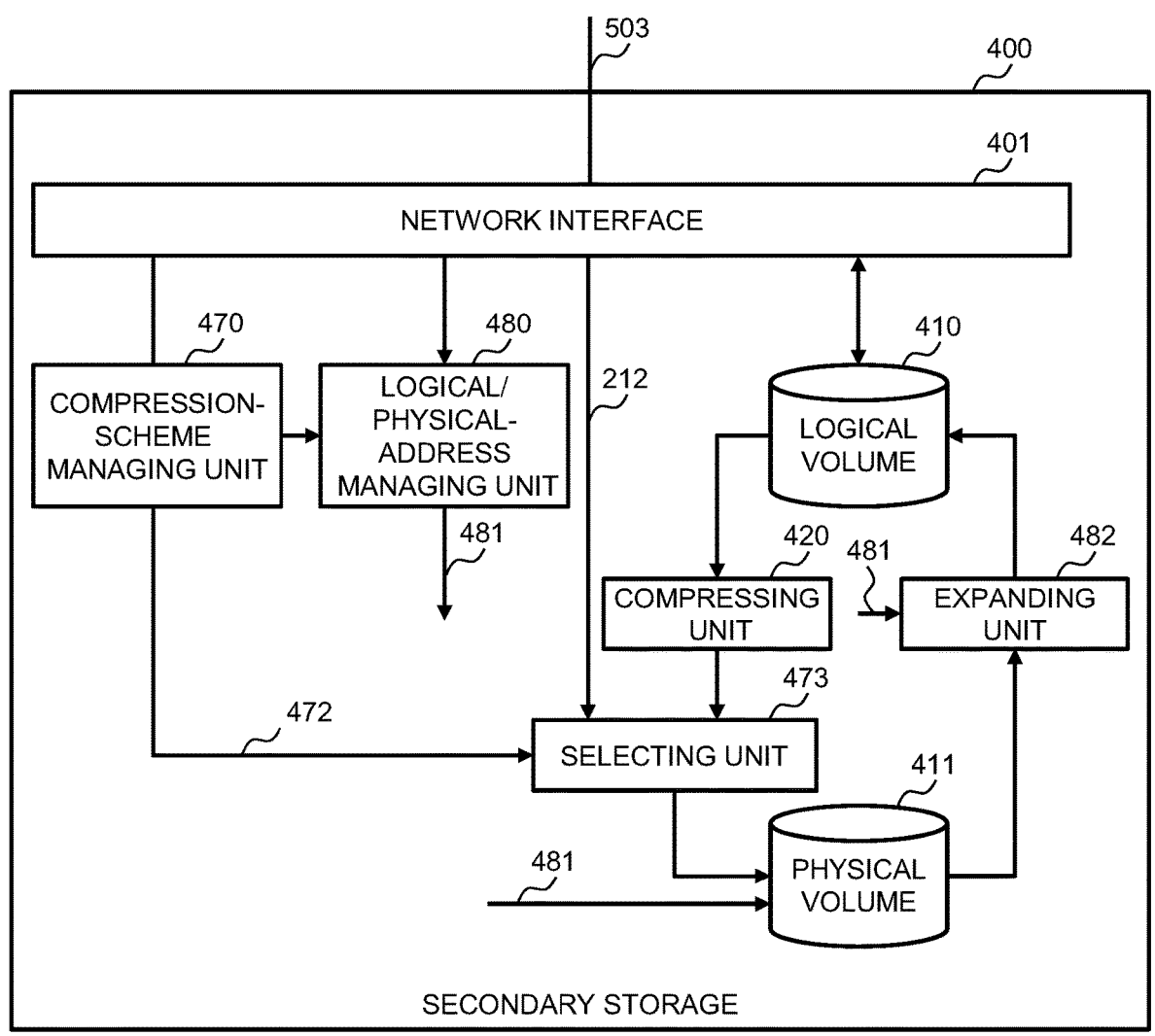
FIG. 9 is an explanatory diagram of a secondary storage in the second embodiment.

FIG. 9 is an explanatory diagram of the secondary storage 400 in the second embodiment. As shown in FIG. 9, the secondary storage 400 includes the network interface 401, the logical volume 410, the physical volume 411, the compressing unit 420, and decompressing unit 482, a selecting unit 473, a logical/physical-address managing unit 480, and a compression-scheme managing unit 470.

When the network interface 401 receives the compressed data 212 from the primary storage 200, the compressed data 212 is directly stored in the physical volume 411 via the selecting unit 473. The compressed data 212 is compressed by the first compression algorithm used by the primary storage 200.

For example, when an abnormality occurs in the primary storage 200 and the secondary storage 400 processes write by the secondary site, the network interface 401 receives a write request via the communication line 503 and writes data in the logical volume 410. The data written in the logical volume 410 is compressed by the compressing unit 420. At this time, the compressing unit 420 uses the second compression algorithm. The compressed data is written in the physical volume 411 via the selecting unit 473.

When read by the secondary site is processed, the network interface 401 receives a read request via the communication line 503 and the compressed data is read from the physical volume 411.

The read compressed data is decompressed by the decompressing unit 482 to be decompressed data and is written in the logical volume 410 to enable a read response. An algorithm used for the decompression is different depending on the read compressed data. However, it only has to be decided according to a control signal 481 from the logical/physical-address managing unit 480 which algorithm is used.

The logical/physical-address managing unit 480 includes a management table in which a logical address of the logical volume 410 and a physical address to be stored in the physical volume 411 are mapped. When data is written in the physical volume 411, the physical address 441 is generated every time and passed to the physical volume 411.

Further, the logical/physical-address managing unit 480 associates a flag for specifying a compression algorithm with a physical address and manages the physical address. When data is read from the physical volume 411, the logical/physical-address managing unit 480 refers to the flag and notifies the control signal 481 for designating the compression algorithm corresponding to the physical address to the decompressing unit 482.

The compression-scheme managing unit 470 manages compression and decompression processing in the secondary storage 400. The secondary storage 400 does not need to perform compression processing in replication and performs the compression processing when performing write by the I/O of the secondary site during failover. The compression-scheme managing unit 470 gives a control signal 472 to the selecting unit 473 to switch processing at a replication time and processing at a write time by the I/O. The compression-scheme managing unit 470 notifies a compression scheme of data written in the physical volume 411 to the logical/physical-address managing unit 480 and causes the logical/physical-address managing unit 480 to register the compression scheme in the management table. Note that the compression processing can be simply performed in the replication.

Figure 10:
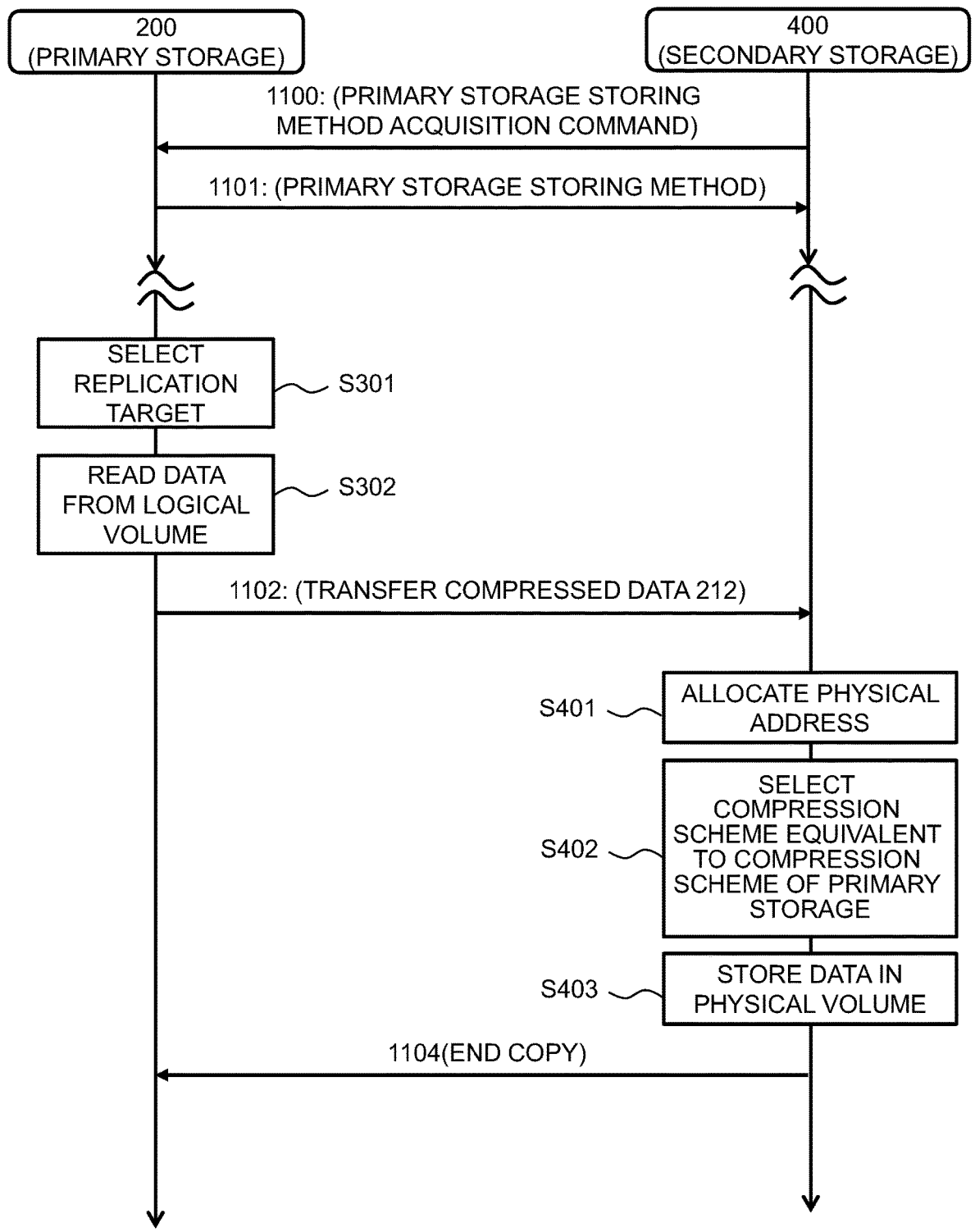
FIG. 10 is a sequence chart for explaining a processing operation of replication in the second embodiment.

FIG. 10 is a sequence chart for explaining a processing operation of replication in the second embodiment. First, the secondary storage 400 transmits a primary storage storing method acquisition command to the primary storage 200 (1100). As in the first embodiment, the primary storage 200 determines a compression algorithm of data to be transferred and notifies a primary storage storing method, that is, a compression algorithm used by the primary storage 200 to the secondary storage 400 (1101). In this embodiment, communication may be added and the secondary storage 400 may determine a compression algorithm of data to be transferred. These kinds of processing are performed, for example, at a system construction time or a replication setting time. The notified compression algorithm of the primary storage 200 is managed by the secondary storage 400. Thereafter, the subsequent replication processing is periodically executed.

In the replication processing, first, the primary storage 200 selects replication target data (step S301). For example, the primary storage 200 only has to select a difference from the last replication as a target.

After step S301, the primary storage 200 reads the data selected as the target from the physical volume 211 (step S302) and transfers the data to the secondary storage 400 (1102). If necessary, decompression and recompression (steps S103 and S104) are performed as in the first embodiment.

The secondary storage 400 allocates a physical address to compressed data received from the primary storage 200 (step S401). Since write by replication is performed, the logical/physical-address managing unit 480 associates a flag indicating a compression scheme used by the primary storage with the physical address (step S402). Thereafter, the logical/physical-address managing unit 480 stores the data in the physical volume 411 (step S403) and notifies a copy end to the primary storage 200 (1104).

Note that processing for notifying the copy end after storing the compressed data in the physical volume 411 is illustrated above. However, the secondary storage 400 may be configured to store the compressed data received from the primary storage 200 in a cache, notify the copy end to the primary storage 200, and, thereafter, store the compressed data in the physical volume 411.

Figure 11:
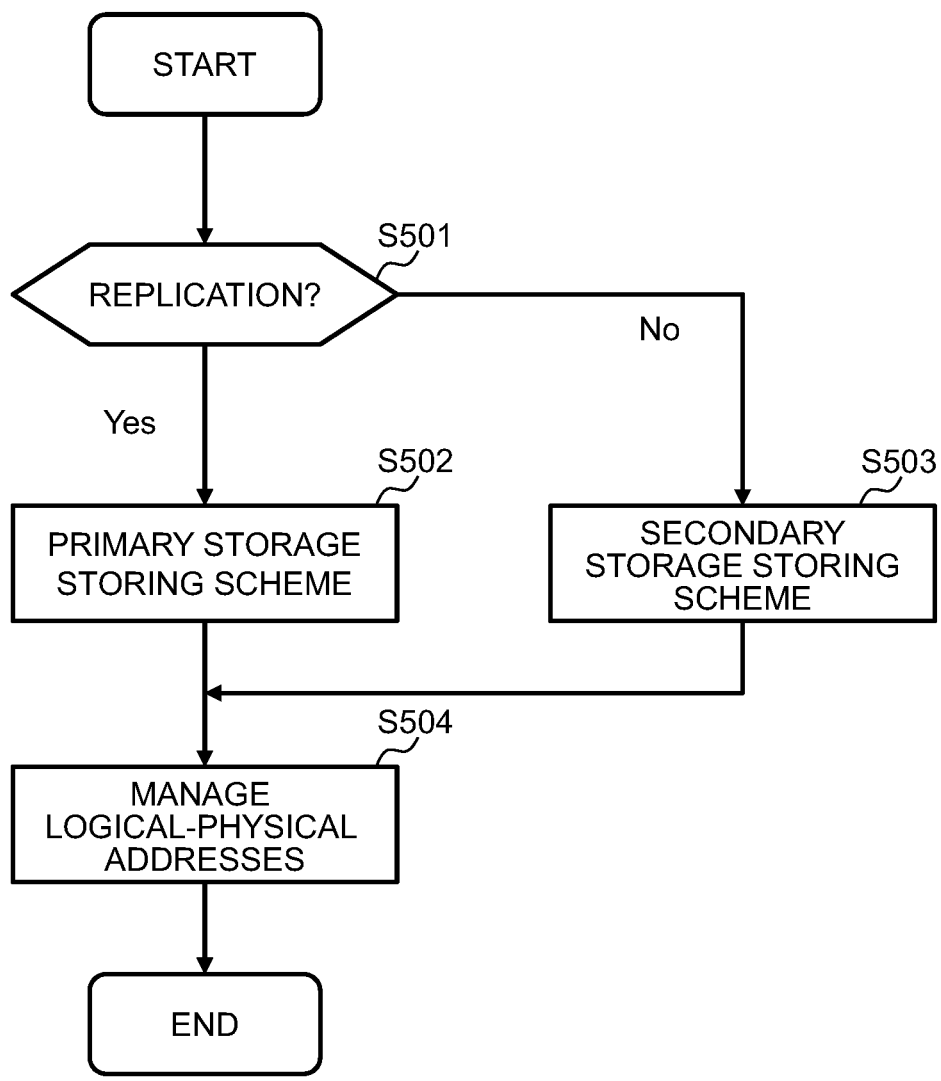
FIG. 11 is an explanatory diagram of the operation of a logical/physical-address managing unit in the second embodiment.

FIG. 11 is an explanatory diagram of the operation of the logical/physical-address managing unit 480 in the second embodiment. When write in the physical volume 411 occurs, the logical/physical-address managing unit 480 determines whether the write is writing by replication (step S501).

If the write is writing by replication (step S501; Yes), the logical/physical-address managing unit 480 selects a primary storage storing scheme, that is, a compression algorithm used by the primary storage 200 (step S502).

If the write is not writing by replication (step S501; No), the logical/physical-address managing unit 480 selects a secondary storage storing scheme, that is, a compression algorithm used by the secondary storage 400 (step S503).

The logical/physical-address managing unit 480 associates a flag for specifying the selected storage scheme with a physical address and manages a correspondence relation between a logical address and the physical address (step S504).

(Modifications)

Variations of a system configuration are explained.

Figure 12:
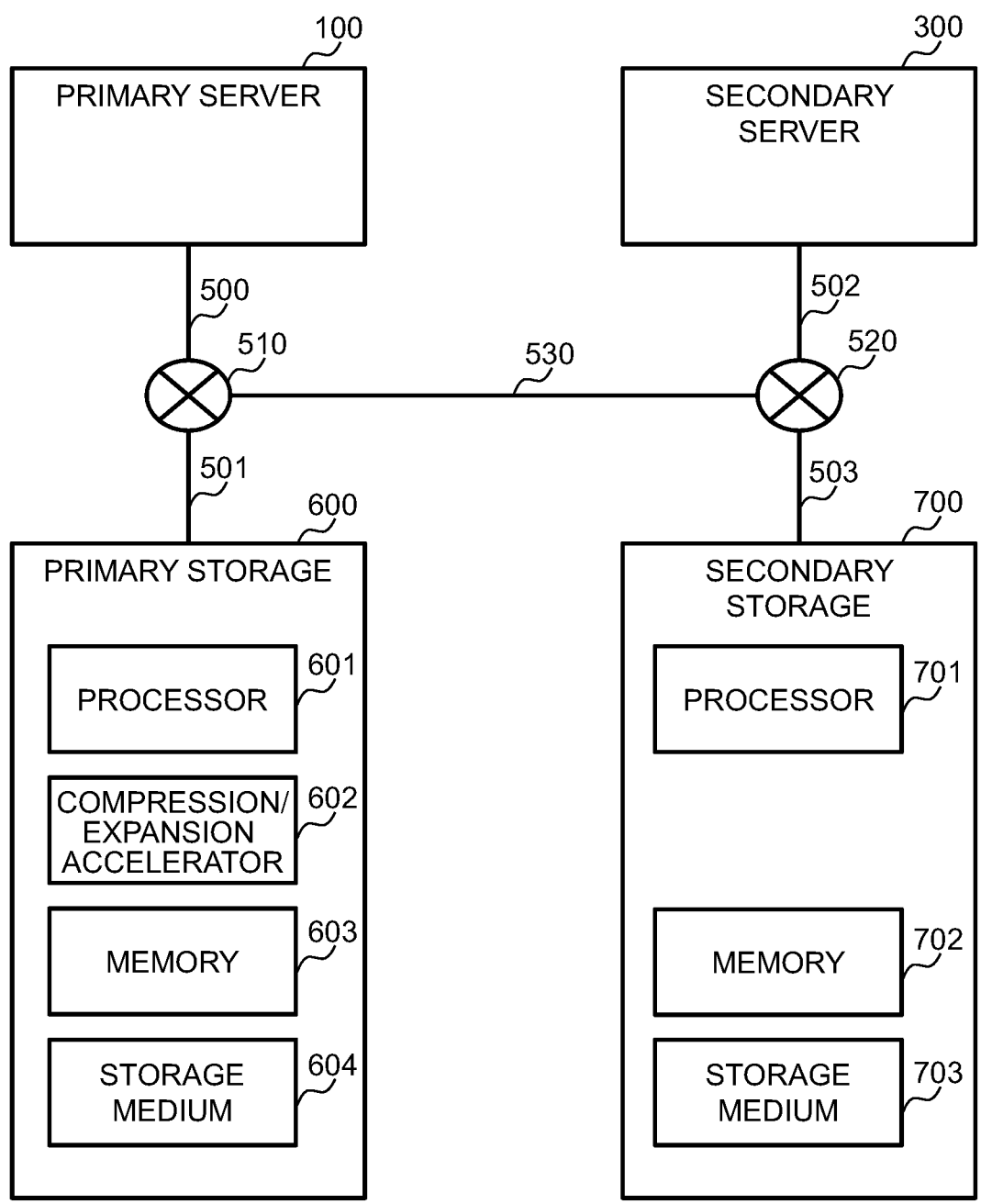
FIG. 12 is a first modification of a system configuration.

FIG. 12 is a first modification of the system configuration. In the configuration shown in FIG. 12, a primary storage 600 includes a processor 601, a compression/decompression accelerator 602, a memory 603, and a storage medium 604.

On the other hand, in the configuration shown in FIG. 12, a secondary storage 700 includes a processor 701, a memory 702, and a storage medium 703 but does not include a compression/decompression accelerator. The processor 701 performs compression and decompression in software processing.

In this way, the primary storage 600 realizes high performance by including the processor 601 that processes read and write by the primary site and the compression/decompression accelerator 602 that processes compression and decompression. The secondary storage 700 is configured to perform software processing of compression and decompression and reduces cost.

Therefore, differences occur in configurations and performance between the primary storage 600 and the secondary storage 700. However, the present invention can be applied to even such a configuration. For example, when the compression and decompression processing is often performed in the primary storage 600 as in the first embodiment, decompression and recompression of data only have to be executed for replication making use of the high performance. When the compression and decompression processing is often performed on the secondary storage 700 side as in the second embodiment, the system only has to be configured to have high performance on the secondary storage side.

Figure 13:
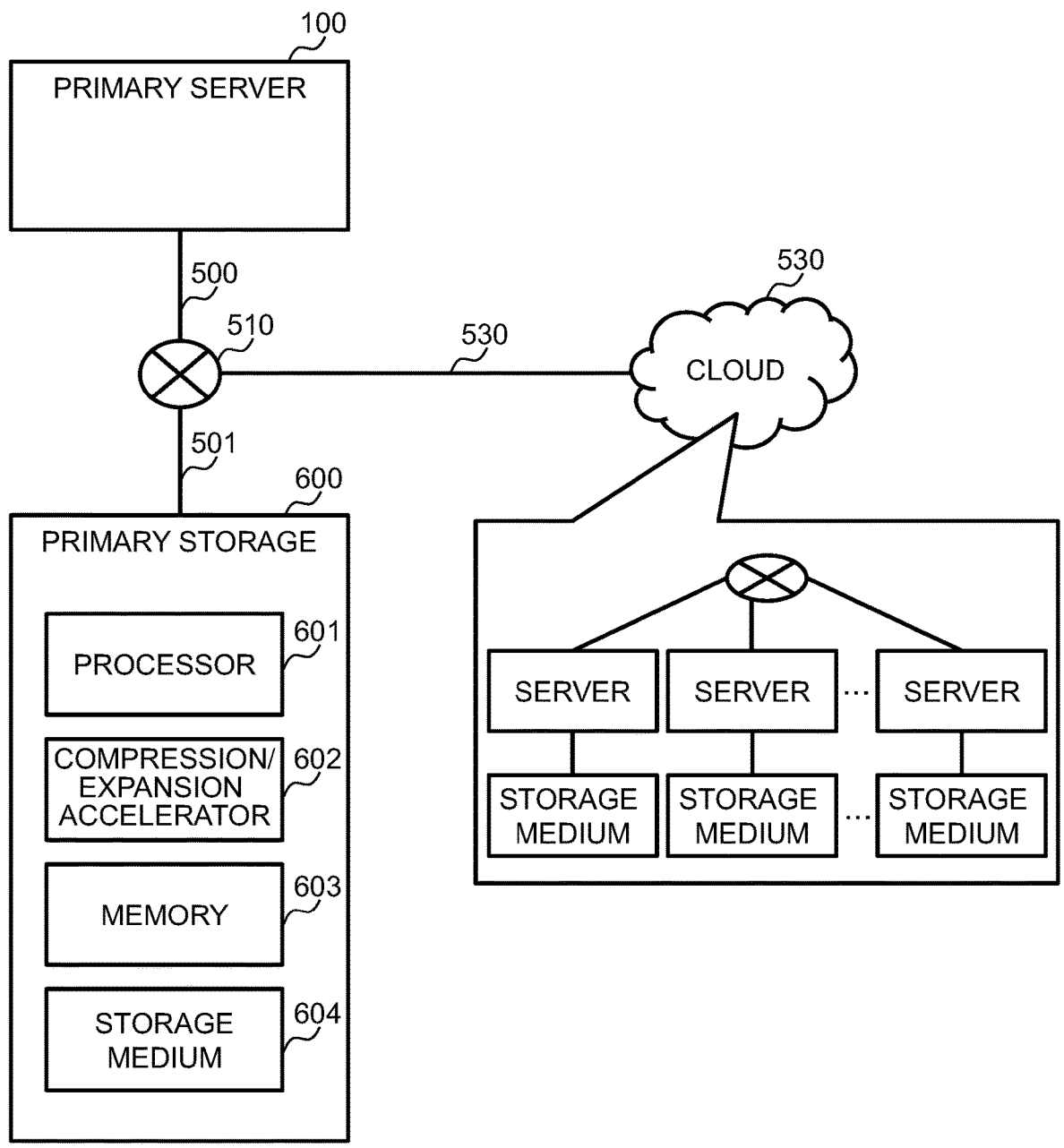
FIG. 13 is a second modification of the system configuration.

FIG. 13 is a second modification of the system configuration. In the configuration shown in FIG. 13, the configuration of the primary storage 600 is the same as the configuration shown in FIG. 12. However, the secondary site side is realized by a software definition type storage that uses Cloud 530. In such a configuration, addition of functions on the secondary storage side is easy. A compression algorithm to which the primary storage 600 is not adapted is considered to be usable. However, replication by compressed data can be realized by decompressing, on the secondary storage side, according to necessity, data compressed by the primary storage.

As explained above, the data replication system disclosed in the embodiments includes a first storage system including a processor and providing a primary site and a second storage system including a processor and providing a secondary site. The first storage system compresses data relating to read and write by the primary site and stores the data in a first physical volume. The second storage system compresses data relating to read and write by the secondary site and stores the data in a second physical volume. When performing replication for transferring the data stored in the first physical volume of the first storage system to the second storage system and storing the data in the second physical volume, the first storage system and the second storage system determine, based on a compression scheme executable by the first storage system and a compression scheme executable by the second storage system, a compression scheme to be applied to transfer target data and transfer the transfer target data compressed by the determined compression scheme.

With such a configuration and an operation, it is possible to suppress a communication amount even between storage systems having different compression schemes. Since the second storage system does not need to decompress and recompress data received in replication, it is possible to reduce requests for processing performance.

According to the configuration of the first embodiment, the first storage system determines a compression scheme of the transfer target data, reads the compressed transfer target data from the first physical volume and performs decompression processing, and compresses the decompressed data with the determined compression scheme of the transfer target data and transfers it to the second storage system. The second storage system receives the data compressed by the second compression scheme and stores the data in the second physical volume.

Therefore, it is possible to reduce a processing load on the second storage system side. The second storage system side does not need to be adapted to the compression scheme used in the first storage system.

Note that, when the compression scheme of the data stored in the first storage system is not possible in the second storage system, the decompression and the compression may be performed.

According to the configuration of the second embodiment, when the first storage system determines to transfer the transfer target data with the stored compression scheme, the first storage system reads the transfer target data from the first physical volume and transmits the transfer target data to the second storage system while keeping the compressed state. The second storage system receives the compressed data and stores the compressed data in the second physical volume and, when read and write for the data are necessary, performs decompression processing corresponding to the first compression scheme.

Therefore, it is possible to reduce a processing load on the first storage system side. The first storage system side does not need to be adapted to a compression scheme used in the second storage system.

Decompression of data relating to replication is limited to a time when read is necessary because of abnormality occurrence or the like.

Note that the second storage system is also capable of decompressing the received compressed data, compressing the data with a different compression scheme, and storing the data in the second physical volume.

Further, the second storage system may be configured to receive the compressed data and store the compressed data in the second physical volume and, when write for the data occurs, decompress the compressed data, compress the data with a different compression scheme, and store the compressed data in the second physical volume.

In the configuration of the first embodiment, the first storage system is adaptable to a plurality of compression schemes and can also be configured to select a compression scheme used in the second storage system at a replication destination and transmit data compressed by the compression scheme.

Therefore, it is possible to perform flexible processing adjusted to the configuration of the second storage system.

When the second storage system at the replication destination is adaptable to a plurality of compression schemes, a compression scheme applied when the transfer target data is transmitted to the second storage system may be determined based on a compression scheme applied when the transfer target data is stored in the first physical volume. For example, if the compression scheme applied when the transfer target data is stored in the first physical volume is usable in the second storage system as well, the transfer target data can be transmitted while being kept compressed by the first compression scheme.

The first storage system may separately include a processor configured to process read and write by the primary site and a processing unit configured to process compression and decompression.

In such a configuration, it is possible to achieve both of high processing performance in the primary site and a cost reduction as a whole.

The second storage system may be a software type storage system configured by a plurality of servers.

In such a configuration, it is possible to operate the second storage system flexibly and at low cost.

Note that the present invention is not limited to the embodiments explained above and includes various modifications. For example, the embodiments explained above are explained in detail in order to clearly explain the present invention and are not always limited to embodiments including all the explained components. Not only deletion of such components but also substitution and addition of components are possible.

REFERENCE SIGNS LIST

10: primary volume, 11: secondary volume, 100: primary server, 200: primary storage, 201: network interface, 210: logical volume, 211: physical volume, 212: compressed data, 220: first compressing unit, 230: decompressing unit, 231: second compressing unit, 232: compressed data, 235: decompressed data, 240: logical/physical-address managing unit, 241: physical address, 250: compression-scheme managing unit, 251: compression scheme designation signal, 252: compression scheme designation signal, 300: secondary server, 400: secondary storage, 401: network interface, 410: logical volume, 411: physical volume, 420: second compressing unit, 420: compressing unit, 430: decompressing unit, 440: logical/physical-address managing unit, 441: physical address, 450: compression-scheme managing unit, 452: control signal, 453: selecting unit, 470: compression-scheme managing unit, 472: control signal, 473: selecting unit, 480: logical/physical-address managing unit, 481: control signal, 482: decompressing unit, 500: communication line, 501: communication line, 502: communication line, 503: communication line, 510: network, 520: network, 530: Cloud, 600: primary storage, 601: processor, 602: compression/decompression accelerator, 603: memory, 604: storage medium, 700: secondary storage, 701: processor, 702: memory, 703: storage medium

What is claimed is:

1. A data replication system comprising:
   a first storage system including a processor and providing a primary site; and
   a second storage system including a processor and providing a secondary site, wherein
   the first storage system compresses first data relating to read and write by the primary site and stores the first data in a first physical volume,
   the second storage system compresses second data relating to read and write by the secondary site and stores the second data in a second physical volume, and
   when performing replication based on a predetermined replication setting for transferring the first data stored in the first physical volume to the second storage system and storing the first data in the second physical volume, the first storage system and the second storage system
      determine, based on a first compression scheme executable by the first storage system and a second compression scheme executable by the second storage system, a determined compression scheme to be applied to transfer target data,
   the first storage system
      determines the first compression scheme of the transfer target data, reads the transfer target data from the first physical volume and performs decompression processing, creating first decompressed data, and
      compresses the first decompressed data with the determined compression scheme of the transfer target data, creating first compressed data, and transfers the first compressed data to the second storage system, and
   the second storage system receives the first compressed data and stores the first compressed data in the second physical volume,
   wherein a processing for the predetermined replication setting is performed at a construction time of the data replication system.

2. The data replication system according to claim 1, wherein, when the first compression scheme of the data stored in the first storage system is not possible in the second storage system, the decompression processing and the compression processing are performed.

3. The data replication system according to claim 1, wherein
   when the first storage system determines to transfer the transfer target data with the first compression scheme,
   the first storage system reads the transfer target data from the first physical volume and transmits the first compressed data to the second storage system while keeping a compressed state of the first compressed data, and
   the second storage system receives the first compressed data and stores the first compressed data in the second physical volume and, when read and write for the data are necessary, performs the decompression processing.

4. The data replication system according to claim 3, wherein the second storage system decompresses the first compressed data received, creating second decompressed data,
compresses the second decompressed data with a different compression scheme, creating second compressed data, and
stores the second compressed data in the second physical volume.

5. The data replication system according to claim 1, wherein the second storage system receives the first compressed data and stores the first compressed data in the second physical volume and,
when write for the data occurs, decompresses the first compressed data, creating second decompressed data, compresses the second decompressed data with a different compression scheme, creating second compressed transfer target data, and stores the second compressed transfer target data in the second physical volume.

6. The data replication system according to claim 1, wherein
the first storage system separately includes a processor configured to process read and write by the primary site and a processing unit configured to process compression and decompression, and
the second storage system is configured by a plurality of servers.

7. A data replication method performed by a data replication system including: a first storage system including a processor and configured to compress first data relating to read and write by a primary site and store the first data in a first physical volume; and a second storage system including a processor and configured to compress second data relating to read and write by a secondary site and store the second data in a second physical volume,
the data replication method comprising:
compressing, the first data relating to read and write by the primary site and storing the data in the first physical volume;
when performing replication based on a predetermined replication setting for transferring the data stored in the first physical volume to the second storage system and storing the first data in the second physical volume, determining based on a first compression scheme executable by the first storage system and a second compression scheme executable by the second storage system, a determined compression scheme to be applied to transfer target data;
determining, via the first storage system, the first compression scheme of the transfer target data;
reading, via the first storage system, the transfer target data from the first physical volume;
performing, via the first storage system, decompression processing, creating first decompressed data;
compressing, via the first storage system, the first decompressed data with the determined compression scheme of the transfer target data, creating first compressed data;
transferring, via the first storage system, the first compressed data to the second storage system; and
receiving, via the second storage system, the first compressed data and stores the first compressed data in the second physical volume,
wherein a processing for the predetermined replication setting is performed at a construction time of the data replication system.

* * * * *